United States Patent
Kim

(10) Patent No.: US 11,942,138 B2
(45) Date of Patent: Mar. 26, 2024

(54) MEMORY SYSTEM INCLUDING SEMICONDUCTOR MEMORY DEVICE AND OPERATION METHOD THEREOF

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 125 days.

(21) Appl. No.: 17/721,708

(22) Filed: Apr. 15, 2022

(65) Prior Publication Data

US 2023/0154518 A1 May 18, 2023

(30) Foreign Application Priority Data

Nov. 16, 2021 (KR) .................. 10-2021-0157713

(51) Int. Cl.
*G11C 11/406* (2006.01)
*G11C 11/408* (2006.01)

(52) U.S. Cl.
CPC ..... *G11C 11/40611* (2013.01); *G11C 11/4085* (2013.01)

(58) Field of Classification Search
CPC .......................... G11C 11/40611; G11C 11/40
USPC .......................................................... 365/222
See application file for complete search history.

(56) References Cited

U.S. PATENT DOCUMENTS

| | | | |
|---|---|---|---|
| 9,032,141 B2 | 5/2015 | Bains et al. | |
| 10,943,637 B2 | 3/2021 | Okuma | |
| 11,094,369 B1* | 8/2021 | Joo | G11C 11/40618 |
| 2020/0005857 A1* | 1/2020 | Ito | G11C 11/40615 |
| 2021/0375346 A1* | 12/2021 | Lim | G11C 11/406 |
| 2022/0189537 A1* | 6/2022 | Kim | G06F 3/0644 |

* cited by examiner

*Primary Examiner* — Muna A Techane
(74) *Attorney, Agent, or Firm* — IP & T GROUP LLP

(57) ABSTRACT

A memory system includes: a memory device suitable for providing row-hammer data to set refresh rates for adjacent word lines of a target word line, and performing a target refresh operation on one or more word lines corresponding to a first row-hammer address according to a first target refresh command; and a memory controller suitable for generating a plurality of sampling addresses by sampling an active address, generating a plurality of counting values by comparing the sampling addresses with the active address, calculating a plurality of adjacent addresses corresponding to the sampling addresses based on the counting values and the row-hammer data, and providing the adjacent addresses as the first row-hammer address with the first target refresh command.

19 Claims, 10 Drawing Sheets

MEMORY SYSTEM INCLUDING SEMICONDUCTOR MEMORY DEVICE AND OPERATION METHOD THEREOF

CROSS-REFERENCE TO RELATED APPLICATION

The present application claims the benefit of Korean Patent Application No. 10-2021-0157713, filed on Nov. 16, 2021, which is incorporated herein by reference in its entirety.

BACKGROUND

1. Field

Various embodiments of the present invention relate to a semiconductor design technology, and more particularly, to a memory system including a semiconductor memory device that performs a target refresh operation.

2. Description of the Related Art

Recently, in addition to a normal refresh operation, an additional refresh operation which will be, hereinafter, referred to as a 'target refresh operation', is being performed on the memory cells of a specific word line (hereinafter, referring to as a 'target word line') that is likely to lose data due to row-hammer phenomenon. The row-hammer phenomenon refers to a phenomenon in which data of memory cells coupled to a specific word line or adjacent word lines disposed adjacent to the specific word line are damaged due to a high number of activations of the specific word line. In order to prevent the row-hammer phenomenon, a target refresh operation is performed on a word line that is activated more than a predetermined number of times, and adjacent word lines disposed adjacent to the word line.

SUMMARY

Embodiments of the present invention are directed to a memory system capable of performing a target refresh operation according to refresh rates of adjacent word lines set according to a physical distance from a target word line.

According to an embodiment of the present invention, a memory system includes a memory device suitable for providing row-hammer data to set refresh rates for adjacent word lines of a target word line, and performing a target refresh operation on one or more word lines corresponding to a first row-hammer address according to a first target refresh command; and a memory controller suitable for generating a plurality of sampling addresses by sampling an active address, generating a plurality of counting values by comparing the sampling addresses with the active address, calculating a plurality of adjacent addresses corresponding to the sampling addresses based on the counting values and the row-hammer data, and providing the adjacent addresses as the first row-hammer address with the first target refresh command.

According to an embodiment of the present invention, a memory controller includes a sampling circuit suitable for storing a plurality of sampling addresses by sampling an active address; an address counting circuit suitable for generating a plurality of counting values by comparing the sampling addresses with the active address, and increasing a counting value corresponding to a sampling address matching the active address; and a radius analysis circuit suitable for setting a plurality of reference counting values based on row-hammer data provided from a semiconductor memory device, calculating and storing a plurality of adjacent addresses corresponding to the sampling addresses into a plurality of latch circuits by comparing the increased counting value with the reference counting values, and providing the adjacent addresses stored in the latch circuits as a row-hammer address with a target refresh command.

According to an embodiment of the present invention, an operation method of a memory system includes providing, at a memory device, row-hammer data to set refresh rates for adjacent word lines of a target word line; generating, at a memory controller, a plurality of sampling addresses by sampling an active address; generating, at the memory controller, a plurality of counting values by comparing the sampling addresses with the active address; calculating, at the memory controller, a plurality of adjacent addresses corresponding to the sampling addresses based on the counting values and the row-hammer data; providing, at the memory controller, the adjacent addresses as a row-hammer address with a target refresh command; and performing, at the memory device, a target refresh operation on one or more word lines corresponding to the row-hammer address according to the target refresh command.

According to an embodiment of the present invention, an operating method of a refresh control circuit includes generating a counting value by comparing a single sampling address with an active address, the sampling address being generated by sampling the active address; generating one or more of K number of adjacent addresses, which are adjacent to the sampling address, by comparing the counting value respectively with K number of thresholds, the adjacent addresses respectively corresponding to the thresholds; and controlling a memory device to perform target refresh operations respectively on one or more word lines represented by the generated adjacent addresses, wherein a Jth one of the K number of thresholds increases as J increases (1≤J≤K), and wherein a Jth one of the K number of adjacent addresses represents, as J increases, a word line disposed farther from a word line represented by the sampling address.

According to embodiments of the present invention, the memory system may differently set the refresh rates of the adjacent word lines according to the physical distance from the target word line, and select the row-hammer address according to the set refresh rates, thereby optimizing the row hammer defense capability and minimizing the power consumption. In addition, it is possible to improve the accuracy and refresh efficiency of the refresh operation by performing the target refresh operation according to the row-hammer address.

DETAILED DESCRIPTION

Figure 1:
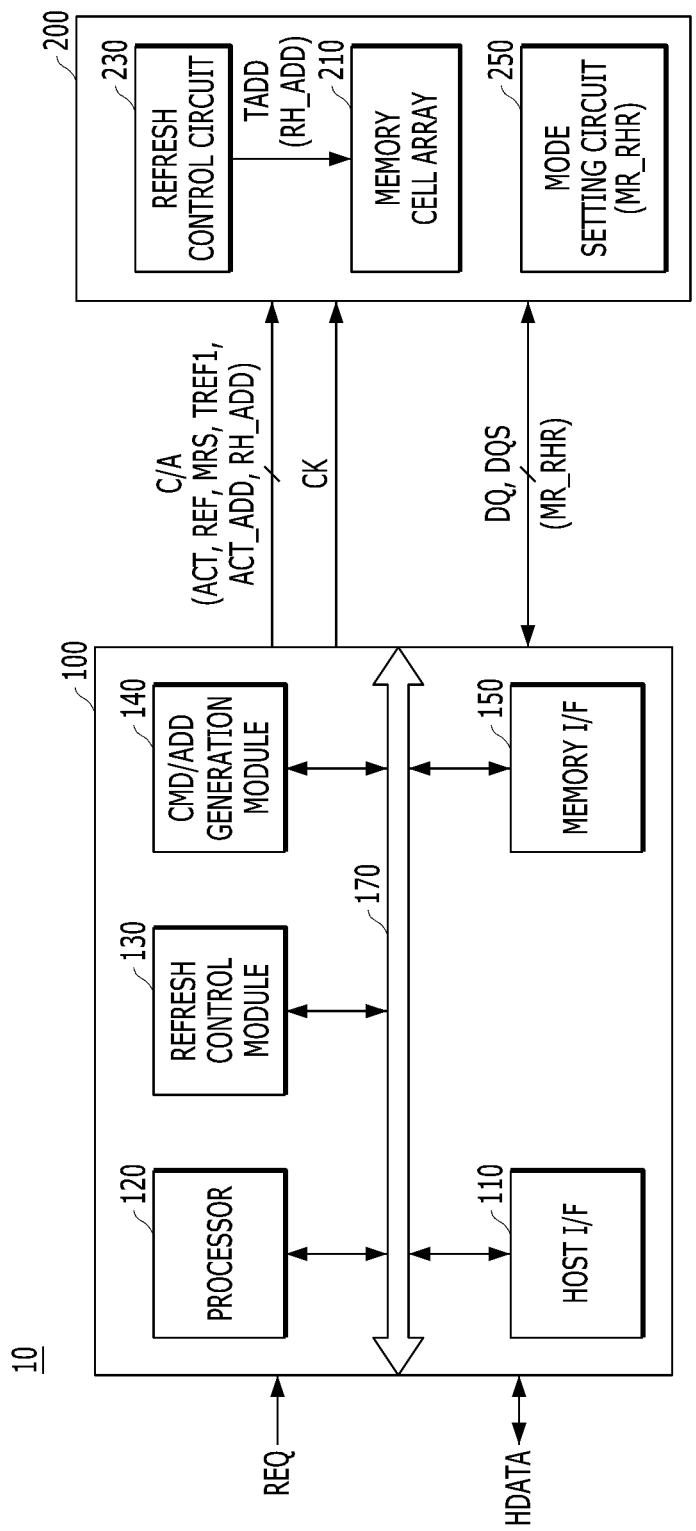
FIG. 1 is a block diagram illustrating a memory system in accordance with an embodiment of the present invention.

Various embodiments of the present invention will be described below in more detail with reference to the accompanying drawings. The present invention may have embodiments in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present invention, the singular forms are intended to include the plural forms as well, unless the context clearly indicates otherwise.

Hereinafter, to focus on a refresh operation, a description of a configuration associated with a data input/output operation will be omitted. In particular, for ease of description, an address used by a memory controller in a memory system may be assigned by a reference numeral "_ADD", and an address used in a memory device may be assigned by a reference numeral "ADD_".

FIG. 1 is a block diagram illustrating a memory system 10 in accordance with an embodiment of the present invention.

Referring to FIG. 1, the memory system 10 may include a memory controller 100, and a semiconductor memory device 200.

The memory controller 100 may control the general operation of the memory system 10 and it may control general data exchange between a host and the semiconductor memory device 200. The memory controller 100 may generate a command/address signal C/A according to a request REQ from the host, and provide the generated command/address signal C/A to the semiconductor memory device 200. The memory controller 100 may provide a clock CK together with the command/address signal C/A to the semiconductor memory device 200. The memory controller 100 may provide data DQ corresponding to host data HDATA provided from the host to the semiconductor memory device 200 together with a data strobe signal DQS. The memory controller 100 may receive the data DQ read from the semiconductor memory device 200 together with the data strobe signal DQS, and provide the data DQ and the data strobe signal DQS to the host as the host data HDATA.

In detail, the memory controller 100 may include a host interface (host I/F) 110, a processor 120, a refresh control module 130, a command/address (CMD/ADD) generation module 140, a memory interface (memory I/F) 150, and a bus 170.

The host interface 110 may be configured to communicate with the host connected to the memory system 10 under the control of the processor 120. For example, the host interface 110 may receive the request REQ and the host data HDATA from the host, and provide the host data HDATA to the host by receiving the data DQ read from the semiconductor memory device 200 through the memory interface 150.

The processor 120 may perform various types of computational and/or other operations for controlling the semiconductor memory device 200, and/or may execute instructions in the form of firmware or other types of software. The processor 120 may receive the request REQ and the host data HDATA provided from the host through the host interface 110. The processor 120 may determine the order of requests to be indicated to the semiconductor memory device 200 among the requests REQ from the host. In order to improve the performance of the semiconductor memory device 200, the processor 120 may schedule the order in which the requests REQ are received from the host and the order of operations to be indicated to the semiconductor memory device 200 differently. The processor 120 may generate various commands corresponding to the request REQ, such as an active command ACT, a normal refresh command REF, a read command, a write command, and an address, to provide the command and address to the refresh control module 130 and the command/address generation module 140. The processor 120 may generate a set number of the normal refresh commands REF at regular intervals. The set number of the normal refresh commands REF may be determined depending on a value described in a specification. For example, the processor 120 may generate 4096 normal refresh commands REF for sequentially refreshing a plurality of word lines of the memory device 200. The processor 120 may transmit the host data HDATA to the memory interface 150. The address generated with the active command ACT may be defined as an active address ACT_ADD. The processor 120 may control overall operations of the host interface 110, the refresh control module 130, the command/address generation module 140, and the memory interface 150.

The refresh control module 130 may generate a first target refresh command TREF1 based on the active command ACT provided from the processor 120. The refresh control module 130 may generate the first target refresh command TREF1 whenever the number of inputs of the active command ACT reaches a certain number. The refresh control module 130 may generate a plurality of sampling addresses (SAM_ADD1 to SAM_ADDm of FIG. 4) by sampling the active address ACT_ADD, and generate a plurality of counting values (CNT_V1 to CNT_Vm of FIG. 4) by comparing the sampling addresses SAM_ADD1 to SAM_ADDm with the active address ACT_ADD. The refresh control module 130 may calculate a plurality of adjacent addresses corresponding to the sampling addresses SAM_ADD1 to SAM_ADDm, based on the counting values CNT_V1 to CNT_Vm and row-hammer data MR_RHR provided from the semiconductor memory device 200. The refresh control module 130 may provide the adjacent addresses as a first row-hammer address RH_ADD with the first target refresh command TREF1. A detailed configuration of the refresh control module 130 in accordance with the embodiment will be described in FIGS. 2 to 7.

The command/address generation module 140 may generate the command/address signal C/A by scheduling the command and address provided from the processor 120 and the refresh control module 130. The command/address generation module 140 may provide the active address ACT_ADD together with the active command ACT, as the command/address signal C/A, provide a mode register command MRS together with the address as the command/address signal C/A, provide the normal refresh command REF as the command/address signal C/A, and provide the first target refresh command TREF1 together with the first row-hammer address RH_ADD as the command/address signal C/A. The mode register command MRS may include a mode register write command MRW for storing and reading setting data stored in a mode setting circuit 250 disposed in the semiconductor memory device 200, and a mode register read command MRR for reading setting data previously stored in the mode setting circuit 250.

The memory interface 150 may be configured to communicate with the semiconductor memory device 200 under the control of the processor 120. For example, the memory interface 150 may transmit the command/address signal C/A and the data DQ to the semiconductor memory device 200, and transmit the data DQ read from the semiconductor memory device 200 to the host interface 110.

The processor 120 may transmit data between the host interface 110, the refresh control module 130, the command/address generation module 140, and the memory interface 150 via the bus 170. According to an embodiment, the host interface 110, the refresh control module 130, the command/address generation module 140, and the memory interface 150 may communicate with each other independently without passing through the bus 170. For example, the refresh control module 130 and the host interface 110 may communicate directly with each other without passing through the bus 170. The refresh control module 130 and the memory interface 150 may communicate with each other directly without passing through the bus 170. The host interface 110 and the memory interface 150 may also communicate directly with each other without passing through the bus 170.

The semiconductor memory device 200 may perform a refresh operation, a write operation, and a read operation according to the clock CK, the command/address signal C/A, the data strobe signal DQS, and/or the data DQ that are provided from the memory controller 100. The refresh operation may include a normal refresh operation in which the semiconductor memory device 200 sequentially refreshes a plurality of word lines during a normal refresh period, and a target refresh operation in which one or more neighboring word lines disposed adjacent to a word line having a large number (or frequency) of activations are refreshed, during a target refresh period.

The semiconductor memory device 200 may generate an internal command (ICMD of FIG. 8) and an internal address (IADD of FIG. 8) by buffering the command/address signal C/A, and generate the active command ACT, the precharge command PCG, the mode register command MRS, the normal refresh command REF, and the first target refresh command TREF1, which are related to a row control operation, by decoding the command ICMD. Depending on an embodiment, the semiconductor memory device 200 may generate a second target refresh command (TREF2 of FIG. 9) whenever the number of inputs of the normal refresh command REF reaches a set number. That is, the first target refresh command TREF1 may be generated and provided from the memory controller 100 while the second target refresh command TREF2 may be generated by the semiconductor memory device 200 itself. The semiconductor memory device 200 may perform the normal refresh operation according to the normal refresh command REF and perform the target refresh operation according to the first target refresh command TREF1 or the second target refresh command TREF2. For reference, the internal address IADD may correspond to the active address ACT_ADD when the active command ACT is generated. Depending on an embodiment, the internal address IADD may correspond to the first row-hammer address RH_ADD when the first target refresh command TREF1 is generated. Further, the semiconductor memory device 200 may additionally generate commands related to data input/output operations (e.g., a read command or a write command) by decoding the internal command ICMD.

In detail, the semiconductor memory device 200 may include a memory cell array 210, a refresh control circuit 230, and the mode setting circuit 250. A detailed configuration of the semiconductor memory device 200 in accordance with embodiments will be described in FIGS. 8 to 10.

The memory cell array 210 may include a plurality of memory cells coupled to a plurality of word lines and a plurality of bit lines, and may be arranged in the form of an array.

The refresh control circuit 230 may provide a target address TADD corresponding to the first row-hammer address RH_ADD according to the first target refresh command TREF1. Depending on an embodiment, the refresh control circuit 230 may generate a second row-hammer address (ADD_RH2 of FIG. 9) by sampling the active address ACT_ADD, and provide the target address TADD by selecting one from a first row-hammer address (ADD_RH1 of FIG. 9) and the second row-hammer address ADD_RH2.

The mode setting circuit 250 may store the row-hammer data MR_RHR, and provide the stored row-hammer data MR_RHR to the memory controller 100 in response to the mode register read command MRR in the form of the data DQ. In particular, in an embodiment of the present invention, the row-hammer data MR_RHR may include information on refresh rates for adjacent word lines set according to a physical distance from a target word line. For example, the row-hammer data MR_RHR may include a refresh rate of 1 for N±1 adjacent word lines, a refresh rate of 0.2 for N±2 adjacent word lines, and a refresh rate of 0.1 for N±3 adjacent word lines.

With the above configuration, the semiconductor memory device 200 may provide the row-hammer data MR_RHR for setting the refresh rates for the adjacent word lines of the target word line to the memory controller 100. Furthermore, the semiconductor memory device 200 may refresh one or more word lines corresponding to the first row-hammer address RH_ADD according to the first target refresh command TREF1, or refresh one or more word lines corresponding to the second target refresh command ADD_RH2 according to the second target refresh command TREF2.

As described above, in accordance with the embodiment of the present invention, in the memory system 10, the semiconductor memory device 200 may store the row-hammer data MR_RHR in the mode setting circuit 250, and provide the stored row-hammer data MR_RHR to the memory controller 100 in response to the mode register read command MRR in the form of the data DQ. Moreover, when a row-hammer attack is applied to an N-th target word line among a plurality of word lines of the memory cell array 210, it is necessary to perform a target refresh operation not only on the N±1 adjacent word lines but also on the N±2 adjacent word lines. In this case, since the row-hammer attack radius may vary depending on the physical distance from the target word line, refresh rates for adjacent word lines may also need to be set differently depending on the physical distance from the target word line. That is, since the row-hammer phenomenon is reduced in probability as the distance from the target word line increases, it is necessary to reduce the refresh rate. On the contrary, since the row-hammer phenomenon is reduced in probability as the distance from the target word line increases in probability as the distance from the target word line decreases, it is necessary to increase the refresh rate.

For example, when the N±1 adjacent word lines are refreshed 10 times, the N±2 adjacent word lines may be set to refresh 2 times, and the N±3 adjacent word lines may be set to refresh 1 time. In the present invention, information on refresh rates for these adjacent word lines may be stored in the semiconductor memory device 200 as the row-hammer data MR_RHR, and the memory controller 100 may control a target refresh operation to be performed based on the row-hammer data MR_RHR. The memory controller 100 may control the closer the physical distance from the target word line, the higher the refresh rate of adjacent word lines, and the farther the physical distance, the lower the refresh rate of adjacent word lines. Accordingly, the memory system 10 according to an embodiment of the present invention may prevent a decrease in refresh efficiency and accuracy that may occur when the same refresh rate is applied to all adjacent word lines, optimize low-hammer defense capabilities, and minimize power consumption.

Figure 2:
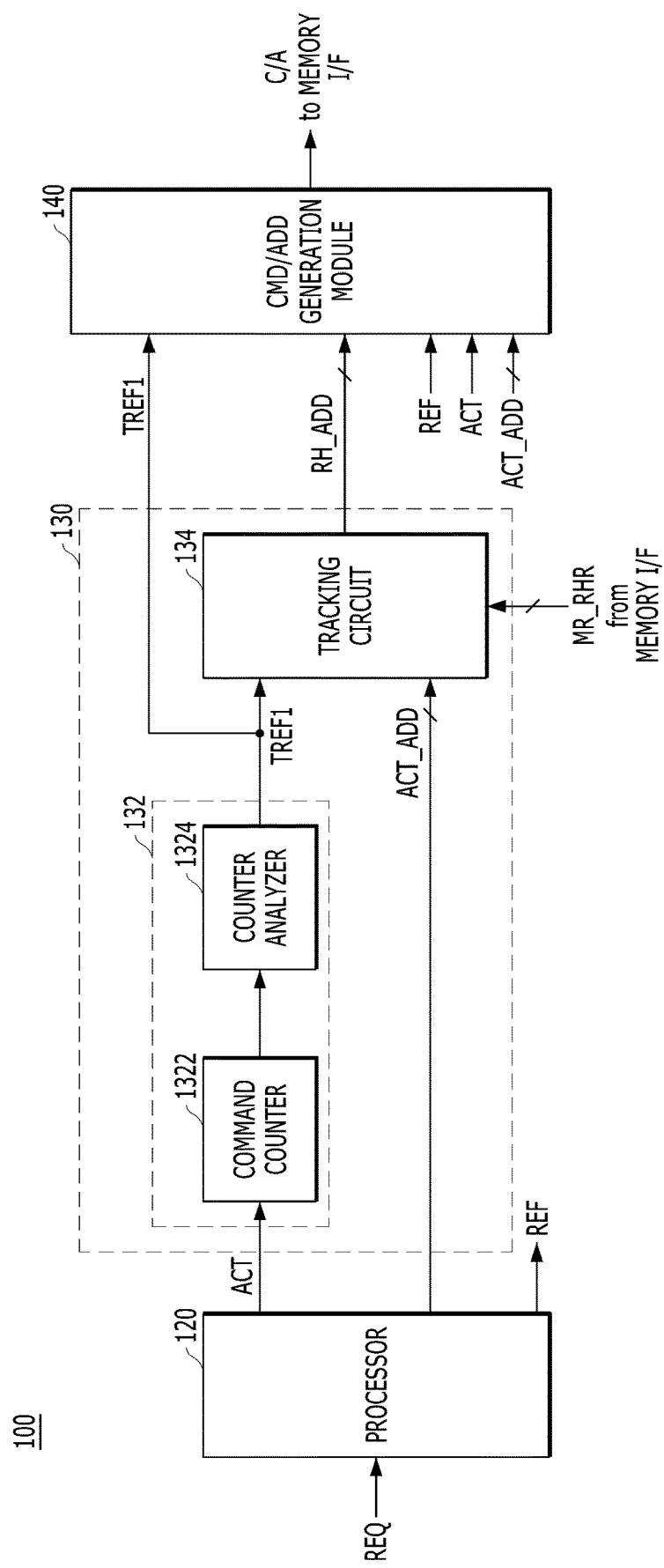
FIG. 2 is a detailed block diagram illustrating a memory controller shown in FIG. 1 in accordance with an embodiment of the present invention.

FIG. 2 is a detailed block diagram illustrating the memory controller 100 shown in FIG. 1 in accordance with an embodiment of the present invention. In FIG. 2, to focus on the characteristics of the embodiment, additional configurations (e.g., the host interface 110 and the memory interface 150) have been omitted.

Referring to FIG. 2, the processor 120 may receive the request REQ from the host through the host interface 110. The processor 120 may generate the active command ACT and the active address ACT_ADD corresponding to the request REQ.

The refresh control module 130 may include a refresh command issue circuit 132 and a tracking circuit 134.

The refresh command issue circuit 132 may generate the first target refresh command TREF1 based on the active command ACT provided from the processor 120. The refresh command issue circuit 132 may issue the first target refresh command TREF1 when the number of inputs of the active command ACT reaches a certain number.

For example, the refresh command issue circuit 132 may include a command counter 1322 and a counter analyzer 1324.

The command counter 1322 may generate a count value by counting the number of inputs of the active command ACT. The counter analyzer 1324 may issue the first target refresh command TREF1 when the count value reaches the certain number. For example, the counter analyzer 1324 may issue at least one first target refresh command TREF1 whenever the count value reaches 10.

The tracking circuit 134 may generate the plurality of sampling addresses SAM_ADD1 to SAM_ADDm by sampling the active address ACT_ADD, and generate the plurality of counting values CNT_V1 to CNT_Vm by comparing the sampling addresses SAM_ADD1 to SAM_ADDm with the active address ACT_ADD. The tracking circuit 134 may calculate and store the plurality of adjacent addresses corresponding to the sampling addresses SAM_ADD1 to SAM_ADDm, based on the counting values CNT_V1 to CNT_Vm and row-hammer data MR_RHR, to provide the first row-hammer address RH_ADD according to the first target refresh command TREF1.

The command/address generation module 140 may generate the command/address signal C/A by scheduling the active command ACT and the active address ACT_ADD provided from the processor 120, and the normal refresh commands REF, the first target refresh command TREF1, and the first row-hammer address RH_ADD provided from the refresh control module 130. The command/address generation module 140 may provide the active address ACT_ADD together with the active command ACT, as the command/address signal C/A. The command/address generation module 140 may provide the normal refresh command REF as the command/address signal C/A, or the first target refresh command TREF1 together with the first row-hammer address RH_ADD as the command/address signal C/A. Though it is not shown, the command/address generation module 140 may provide the mode register command MRS together with the address as the command/address signal C/A, under the control of the processor 120.

Figure 3:
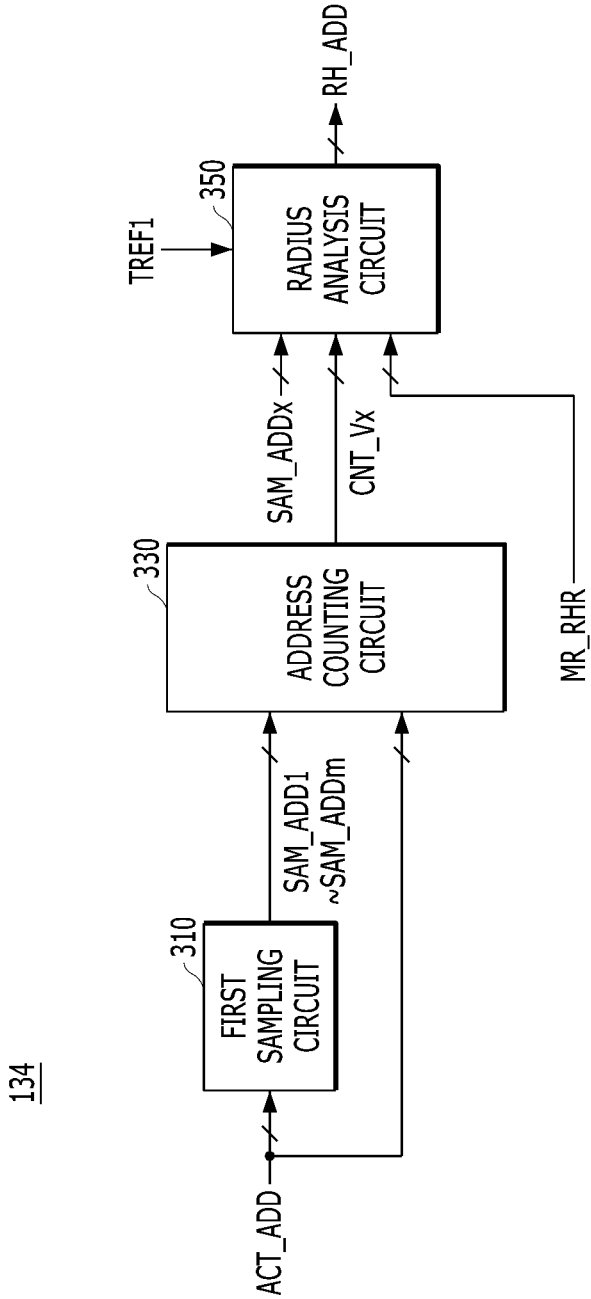
FIG. 3 is a detailed block diagram illustrating a tracking circuit of FIG. 2 in accordance with an embodiment of the present invention.
Figure 4:
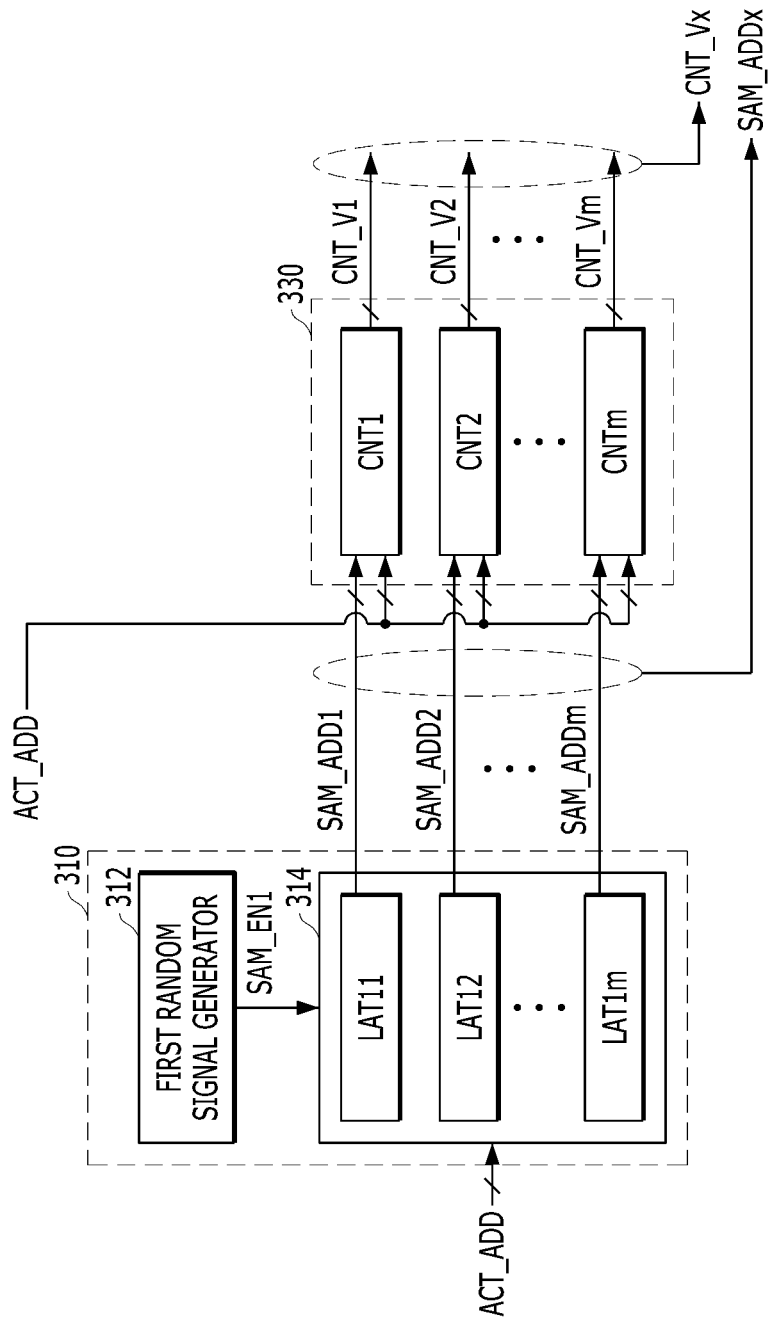
FIG. 4 is a detailed block diagram illustrating a first sampling circuit and an address counting circuit of FIG. 3 in accordance with an embodiment of the present invention.

FIG. 3 is a detailed block diagram illustrating the tracking circuit 134 of FIG. 2 in accordance with an embodiment of the present invention. FIG. 4 is a detailed block diagram illustrating a first sampling circuit 310 and an address counting circuit 330 of FIG. 3 in accordance with an embodiment of the present invention.

Referring to FIG. 3, the tracking circuit 134 may include the first sampling circuit 310, the address counting circuit 330, and a radius analysis circuit 350.

The first sampling circuit 310 may store the plurality of sampling addresses SAM_ADD1 to SAM_ADDm by sampling the active address ACT_ADD. For example, referring to FIG. 4, the first sampling circuit 310 may include a first random signal generator 312 and a first sampling latch circuit 314. The first random signal generator 312 may generate a first sampling signal SAM_EN1 that is randomly enabled. The first random signal generator 312 may be implemented with a linear feedback shift register (LFSR) based random pattern generator or a pseudo-random binary sequence (PRBS) based random pattern generator. The first sampling latch circuit 314 may store the active address ACT_ADD as the sampling addresses SAM_ADD1 to SAM_ADDm according to the first sampling signal SAM_EN1. For example, the first sampling latch circuit 314 may include a plurality of latches LAT11 to LAT1m, which may sequentially store the active address ACT_ADD as the sampling addresses SAM_ADD1 to SAM_ADDm whenever the first sampling signal SAM_EN1 is enabled.

The address counting circuit 330 may generate the plurality of counting values CNT_V1 to CNT_Vm corresponding to the sampling addresses SAM_ADD1 to SAM_ADDm. The address counting circuit 330 may compare the sampling addresses SAM_ADD1 to SAM_ADDm with the active address ACT_ADD, whenever the active address ACT_ADD is inputted, and increase a counting value corresponding to a sampling address matching the active address ACT_ADD. For example, referring to FIG. 4, the address counting circuit 330 may include a plurality of counters CNT1 to CNTm corresponding to the sampling addresses SAM_ADD1 to SAM_ADDm. Each of the counters CNT1 to CNTm may compare a corresponding sampling address SAM_ADDx, x being an integer from 1 to m, with the active address ACT_ADD, to increase its counting value CNT_Vx by "+1" when the comparison result matches. According to an embodiment, the address counting circuit 330 may be initialized at a predetermined period. For example, the address counting circuit 330 may be initialized for each refresh window time tREFW, which is a maximum time interval between adjacent refresh operations for the same memory cell. In the following embodiment, when the counting value CNT_Vx is changed (i.e., increased), it will be described as an example that the changed counting value CNT_Vx and the corresponding sampling address SAM_ADDx are provided to the radius analysis circuit 350.

The radius analysis circuit 350 may set a plurality of reference counting values (N1_SET to Nk_SET of FIG. 5) based on the row-hammer data MR_RHR. For example, the radius analysis circuit 350 may calculate the plurality of reference counting values N1_SET to Nk_SET based on refresh rates for N±1, N±2, . . . N±k adjacent word lines included in the row-hammer data MR_RHR. The radius analysis circuit 350 may compare the changed counting value CNT_Vx with the reference counting values N1_SET to Nk_SET, and calculate one or more adjacent addresses (SAM_ADD_ADJ of FIG. 7) using the corresponding sampling address when the comparison result matches. The radius analysis circuit 350 may selectively store the calculated adjacent addresses SAM_ADD_ADJ. The radius analysis circuit 350 may output the stored adjacent addresses as the first row-hammer address RH_ADD according to the first target refresh command TREF1.

Figure 5:
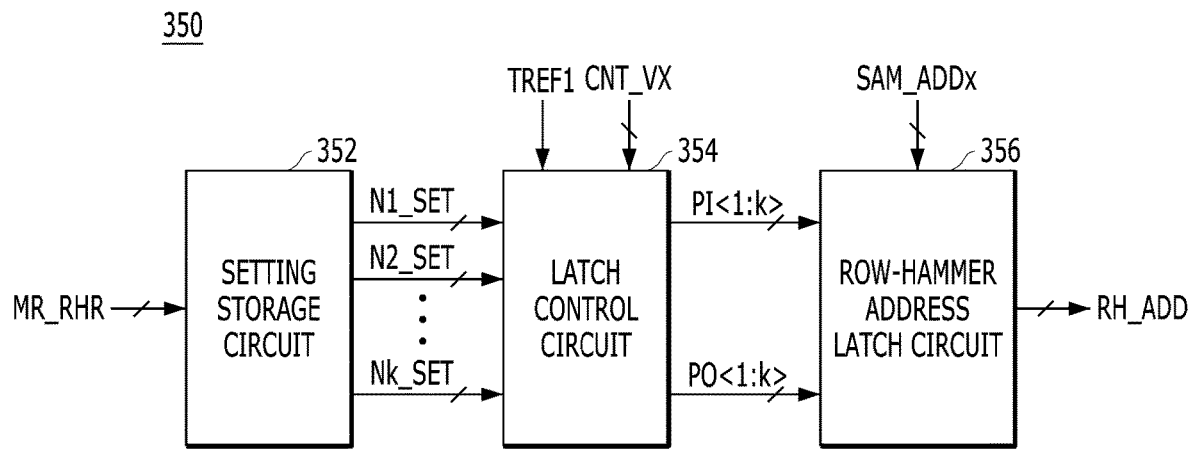
FIG. 5 is a detailed block diagram illustrating a radius analysis circuit of FIG. 3 in accordance with an embodiment of the present invention.
Figure 6:
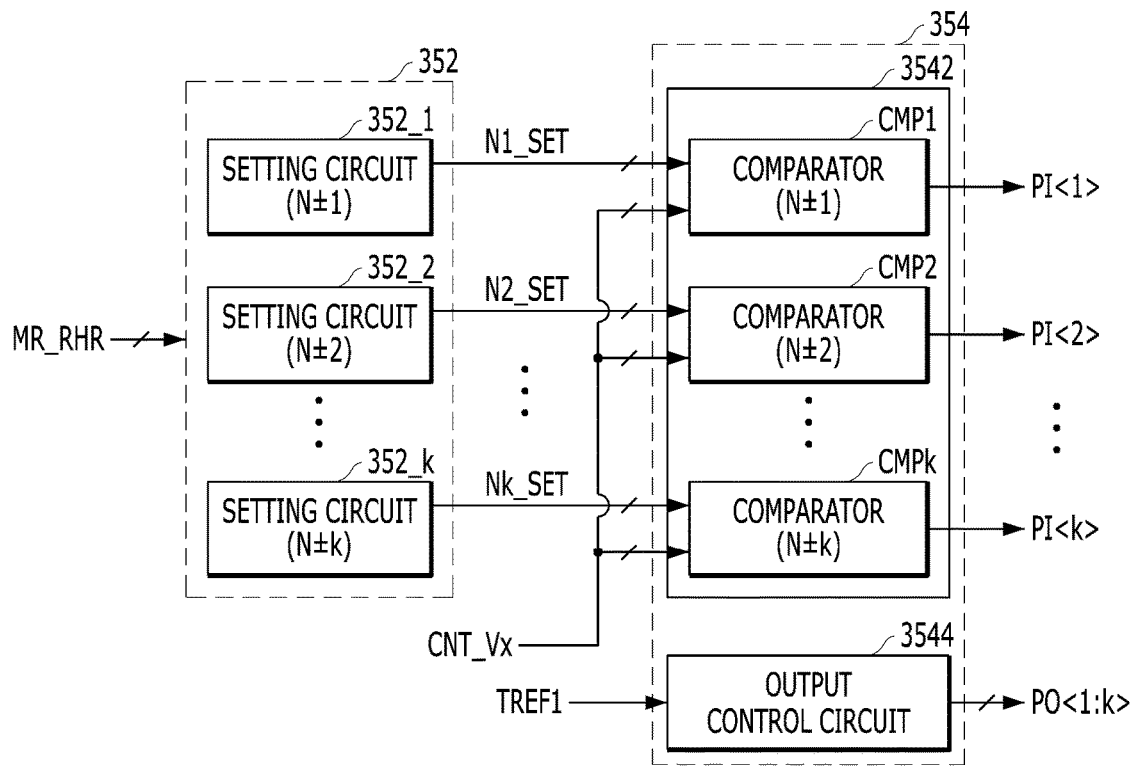
FIG. 6 is a detailed block diagram illustrating a setting storage circuit and a latch control circuit of FIG. 5 in accordance with an embodiment of the present invention.

FIG. 5 is a detailed block diagram illustrating the radius analysis circuit 350 of FIG. 3 in accordance with an embodiment of the present invention. FIG. 6 is a detailed block diagram illustrating a setting storage circuit 352 and a latch control circuit 354 of FIG. 5 in accordance with an embodiment of the present invention.

Referring to FIG. 5, the radius analysis circuit 350 may include the setting storage circuit 352, the latch control circuit 354, and a row-hammer address latch circuit 356.

The setting storage circuit 352 may set the plurality of reference counting values N1_SET to Nk_SET based on the row-hammer data MR_RHR. For example, referring to FIG. 6, the setting storage circuit 352 may include first to k-th radius setting circuits 352_1 to 352_k. The first to k-th radius setting circuits 352_1 to 352_k may calculate and store first to k-th reference counting values N1_SET to Nk_SET based on the refresh rates for N±1, N±2, . . . N±k adjacent word lines included in the row-hammer data MR_RHR. For example, when the row-hammer data MR_RHR includes a refresh rate of 1 for N±1 adjacent word lines, a refresh rate of 0.2 for N±2 adjacent word lines, and a refresh rate of 0.1 for N±3 adjacent word lines, the first radius setting circuit 352_1 may generate the first reference counting values N1_SET of "1", the second radius setting circuit 352_2 may generate the second reference counting values N2_SET of "5", and the third radius setting circuit 352_3 may generate the third reference counting values N3_SET of "10".

The latch control circuit 354 may generate first to k-th input control signals PI<1:k> by comparing the changed counting value CNT_Vx with the first to k-th reference counting values N1_SET to Nk_SET. The latch control circuit 354 may generate first to k-th output control signals PO<1:k> according to the first target refresh command TREF1. For example, referring to FIG. 6, the latch control circuit 354 may include an input control circuit 3542 and an output control circuit 3544. The input control circuit 3542 may include first to k-th comparators CMP1 to CMPk, each of which compares the changed counting value CNT_Vx with a corresponding reference counting value to enable a corresponding input control signal when the comparison result matches. The output control circuit 3544 may sequentially enable the first to k-th output control signals PO<1:k> whenever the first target refresh command TREF1 is inputted.

The row-hammer address latch circuit 356 may store one or more adjacent addresses SAM_ADD_ADJ corresponding to the sampling address SAM_ADDx according to the first to k-th input control signals PI<1:k>, and output the stored adjacent addresses as the first row-hammer address RH_ADD according to the first to k-th output control signals PO<1:k>.

Figure 7:
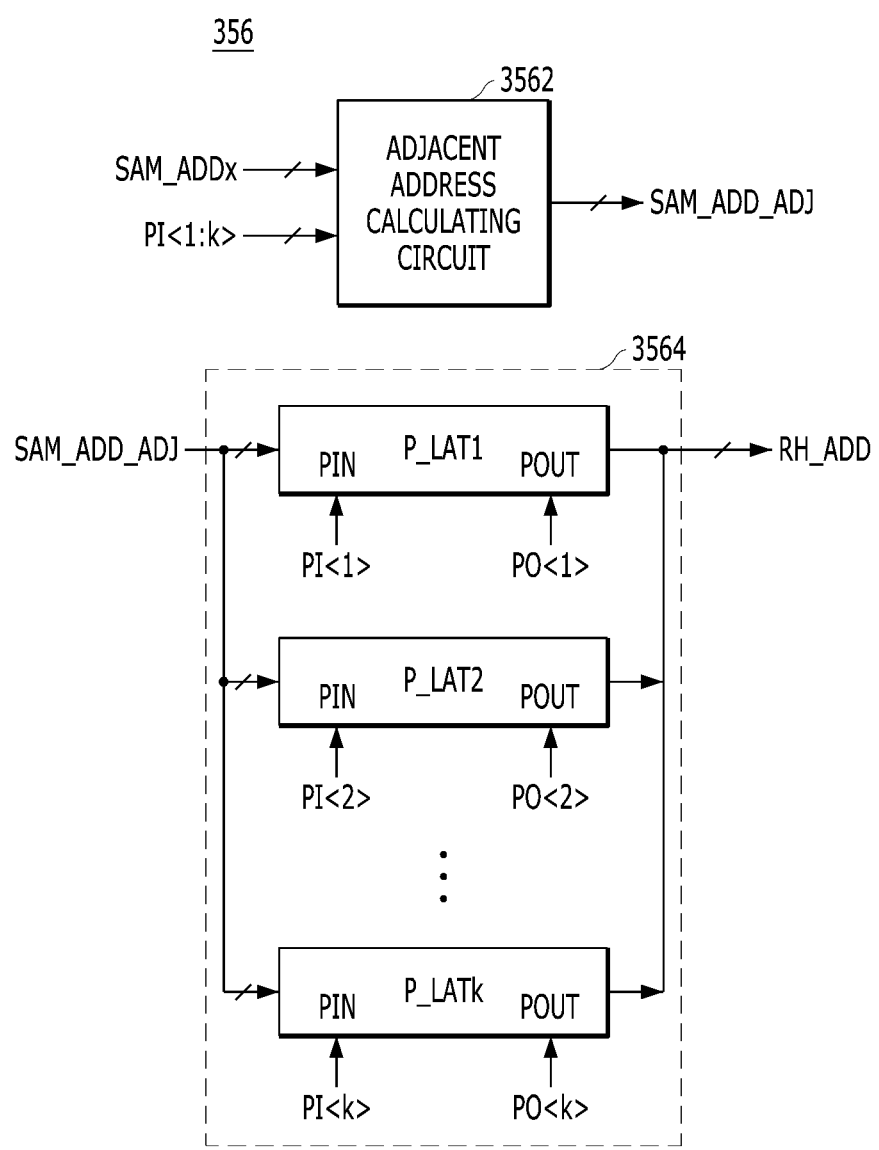
FIG. 7 is a detailed block diagram illustrating a row-hammer address latch circuit of FIG. 5 in accordance with an embodiment of the present invention.

FIG. 7 is a detailed block diagram illustrating the row-hammer address latch circuit 356 of FIG. 5 in accordance with an embodiment of the present invention.

Referring to FIG. 7, the row-hammer address latch circuit 356 may include an adjacent address calculating circuit 3562 and a pipe latch circuit 3564.

The adjacent address calculating circuit 3562 may calculate one or more adjacent addresses SAM_ADD_ADJ using the sampling address SAM_ADDx, according to an enabled one among the first to k-th input control signals PI<1:k>. For example, the adjacent address calculating circuit 3562 may calculate one or more adjacent addresses SAM_ADD_ADJ by increasing and/or decreasing the sampling address SAM_ADDx by "+1" when the first input control signal PI<1> is enabled. The adjacent address calculating circuit 3562 may calculate one or more adjacent addresses SAM_ADD_ADJ by increasing and/or decreasing the sampling address SAM_ADDx by "+2" when the second input control signal PI<2> is enabled. In a such way, the adjacent address calculating circuit 3562 may calculate one or more adjacent addresses SAM_ADD_ADJ by increasing and/or decreasing the sampling address SAM_ADDx by "+k" when the k-th input control signal PI<k> is enabled. Depending on an embodiment, the adjacent address calculating circuit 3562 may be implemented with a subtractor or an adder.

The pipe latch circuit 3564 may store the adjacent addresses SAM_ADD_ADJ provided from the adjacent address calculating circuit 3562 according to the first to k-th input control signals PI<1:k>, and output the stored adjacent addresses as the first row-hammer address RH_ADD according to the first to k-th output control signals PO<1:k>. For example, the pipe latch circuit 3564 may include first to k-th latch circuits P_LAT1 to P_LATk, respectively receiving the first to k-th input control signals PI<1:k> and the first to k-th output control signals PO<1:k>. Each of the first to k-th latch circuits P_LAT1 to P_LATk may store the adjacent addresses SAM_ADD_ADJ provided from the adjacent address calculating circuit 3562 when a corresponding input control signal is enabled, and may output its stored adjacent addresses as the first row-hammer address RH_ADD when a corresponding output control signal is enabled. Depending on an embodiment, the first to k-th latch circuits P_LAT1 to P_LATk may be initialized for each refresh window time tREFW.

Figure 8:
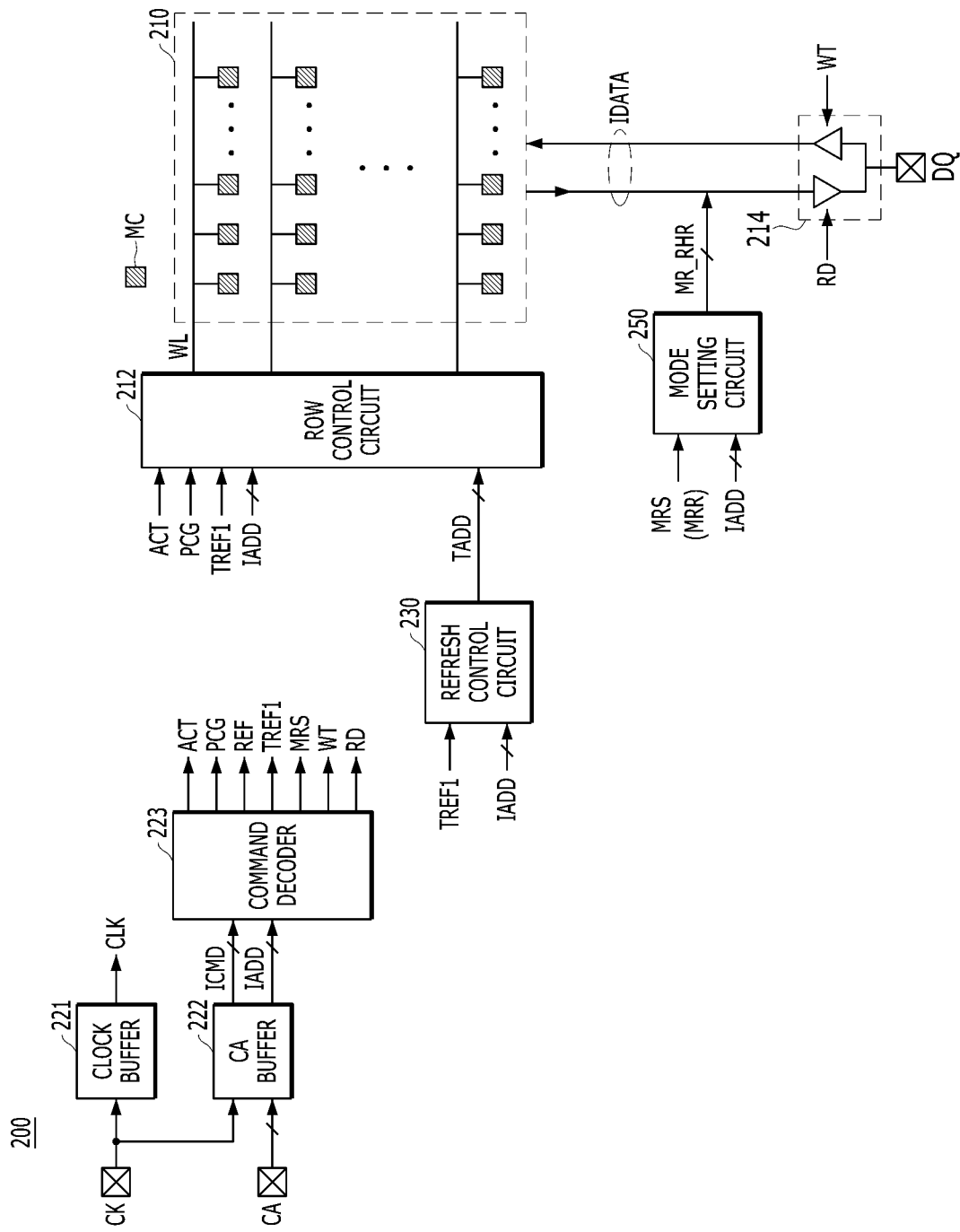
FIG. 8 is a configuration diagram illustrating a memory device shown in FIG. 1 in accordance with an embodiment of the present invention.

FIG. 8 is a configuration diagram illustrating the semiconductor memory device 200 shown in FIG. 1 in accordance with an embodiment of the present invention.

Referring to FIG. 8, the semiconductor memory device 200 may include the memory cell array 210, a row control circuit 212, a data input/output (I/O) circuit 214, a clock buffer 221, a command/address (CA) buffer 222, a command decoder 223, the refresh control circuit 230, and the mode setting circuit 250.

The memory cell array 210 may include a plurality of memory cells MC coupled to word lines WL and bit lines which may be arranged in the form of an array. The memory cell array 210 may be composed of at least one bank. The number of banks or the number of memory cells MC may be determined depending on the capacity of the semiconductor memory device 200.

The clock buffer 221 may receive the clock CK from the memory controller 100. The clock buffer 221 may generate an internal clock CLK by buffering the clock CK. Depending on an embodiment, the memory controller 100 may transfer system clocks CK_t and CK_c to the semiconductor memory device 200 in a differential manner, and the semiconductor memory device 200 may include clock buffers that receive the differential clocks CK_t and CK_c, respectively.

The CA buffer 222 may receive the command/address signal C/A from the memory controller 100 based on the clock CK. The CA buffer 222 may sample the command/address signal C/A based on the clock CK and output the internal command ICMD and the internal address IADD. Consequently, the semiconductor memory device 200 may be synchronized with the clock CK.

The command decoder 223 may decode the internal command ICMD which is output from the CA buffer 222 to generate the active command ACT, the precharge command PCG, the normal refresh command REF, the first target refresh command TREF1, the mode register command MRS, the read command RD, the write command WT, and the like.

The refresh control circuit 230 may latch the internal address IADD as the target address TADD according to the first target refresh command TREF1. At this time, the internal address IADD may correspond to the first row-hammer address RH_ADD provided from the memory controller 100.

The mode setting circuit 250 may perform various setting operations by decoding at least some bits of the internal address IADD in response to the mode register command MRS. The mode setting circuit 250 may be implemented as a known mode register set circuit. The mode setting circuit 250 may store the row-hammer data MR_RHR, and provide the stored row-hammer data MR_RHR to the data I/O circuit 214 through an internal data bus IDATA in response to the mode register read command MRR of the mode register command MRS.

The data I/O circuit 214 may receive the data DQ from the memory controller 100 and load the data DQ on the internal data bus IDATA according to the write command WT, or transmit internal data read from the memory cell array 210 to the data DQ according to the read command RD. In particular, the data I/O circuit 214 may output the data DQ to include the row-hammer data MR_RHR provided from the mode setting circuit 250 to the memory controller 100.

The row control circuit 212 may activate at least one word line WL corresponding to the internal address IADD according to the active command ACT, and precharge the activated word line WL according to the precharge command PCG. In order to select a word line to be refreshed during a normal refresh operation, a refresh counter (not shown) for generating a counting address that is sequentially increasing according to the normal refresh command REF may be additionally provided. The row control circuit 212 may perform the normal refresh operation of sequentially refreshing the plurality of word lines WL corresponding to the counting address according to the normal refresh command REF. The row control circuit 212 may perform a target refresh operation of refreshing one or more neighboring word lines corresponding to the target address TADD according to the first target refresh command TREF1.

Furthermore, the semiconductor memory device 200 of FIG. 8 performs the target refresh operation according to the first target refresh command TREF1 and the first row-hammer address RH_ADD provided from the memory controller 100. In the following embodiments, a case where the semiconductor memory device 200 performs a target refresh operation according to the self-generated second target refresh command TREF2 in addition to the first target refresh command TREF1 and the first row-hammer address RH_ADD provided from the memory controller 100, will be described.

Figure 9:
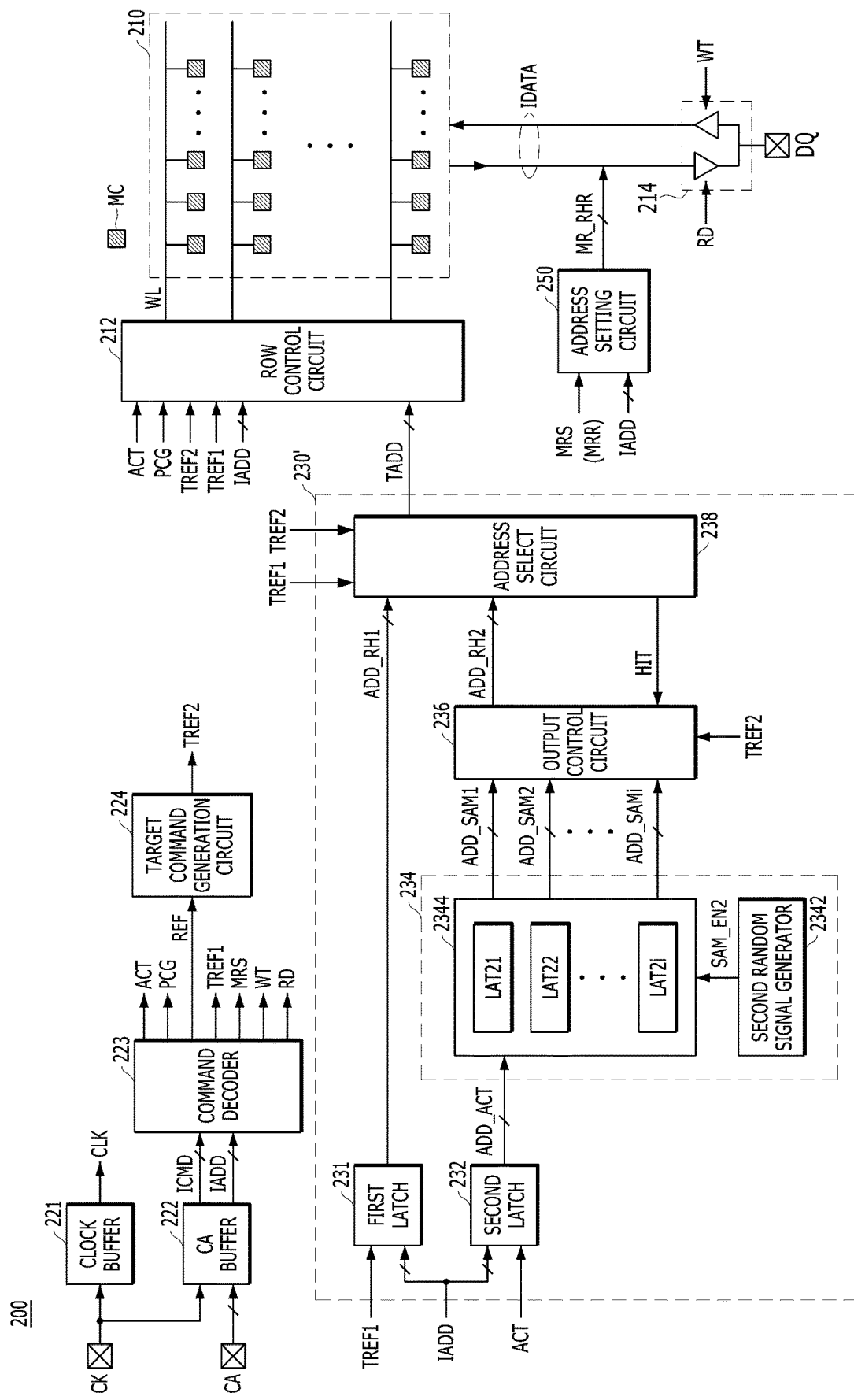
FIG. 9 is a configuration diagram illustrating a memory device shown in FIG. 1 in accordance with another embodiment of the present invention.
Figure 10:
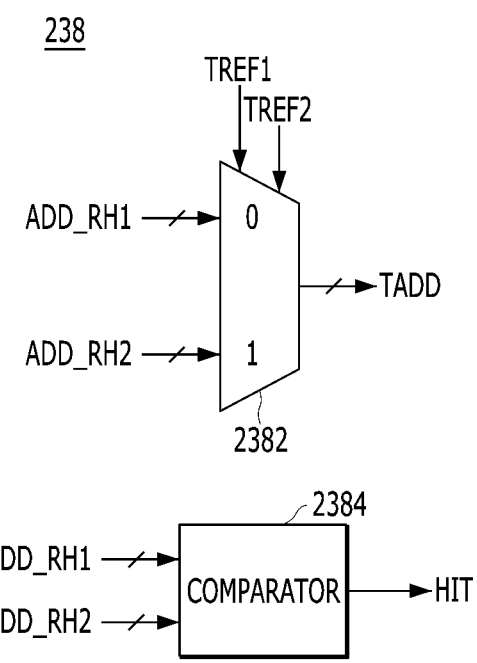
FIG. 10 is a detailed block diagram illustrating an address select circuit of FIG. 9 in accordance with an embodiment of the present invention.

FIG. 9 is a configuration diagram illustrating the semiconductor memory device 200 shown in FIG. 1 in accordance with another embodiment of the present invention. FIG. 10 is a detailed configuration diagram illustrating the address select circuit 238 of FIG. 9. In FIGS. 8 and 9, the same configuration is denoted by the same reference numerals.

Referring to FIG. 9, the semiconductor memory device 200 may include the memory cell array 210, a row control circuit 212, a data input/output (I/O) circuit 214, a clock buffer 221, a command/address (CA) buffer 222, a command decoder 223, a target refresh command generation circuit 224, the refresh control circuit 230', and the mode setting circuit 250.

The memory cell array 210, the data I/O circuit 214, the clock buffer 221, the CA buffer 222, the command decoder 223 and the mode setting circuit 250 of FIG. 9 may have substantially the same configurations as those in FIG. 8.

The target command generation circuit 224 may generate a second target refresh command TREF2 based on the normal refresh command REF. The target command generation circuit 224 may generate the second target refresh command TREF2 whenever the number of inputs of the normal refresh command REF reaches a certain number. In an embodiment, a frequency of the first target refresh command TREF1 issued by the refresh command issue circuit 132 of the memory controller 100 may be set differently from a frequency of the second target refresh command TREF2 issued by the target command generation circuit 224 of the semiconductor memory device 200. For example, the first target refresh command TREF1 may be generated after issuing 4096 normal refresh commands REF, and the second target refresh command TREF2 may be generated after issuing 8192 normal refresh commands REF.

The refresh control circuit 230' may latch the internal address IADD as the first row-hammer address ADD_RH1 according to the first target refresh command TREF1. The refresh control circuit 230' may latch the internal address IADD as the active address ADD_ACT according to the active command ACT, and randomly sample the active address ADD_ACT to store a plurality of sampling addresses ADD_SAM1 to ADD_SAMi. The refresh control circuit 230' may sequentially output the sampling addresses ADD_SAM1 to ADD_SAMi as a second row-hammer address ADD_RH2 according to the second target refresh command TREF2. The refresh control circuit 230' may output the target address TADD by selecting any of the first row-hammer address ADD_RH1 and the second row-hammer address ADD_RH2.

In detail, the refresh control circuit 230' may include a first latch 231, a second latch 232, a second sampling circuit 234, an output control circuit 236, and the address select circuit 238.

The first latch 231 may output the first row-hammer address ADD_RH1 by latching the internal address IADD according to the first target refresh command TREF1. The first row-hammer address ADD_RH1 may correspond to the first row-hammer address RH_ADD provided from the memory controller 100.

The second latch 232 may output the active address ADD_ACT by latching the internal address IADD according to the active command ACT.

The second sampling circuit 234 may generate the sampling addresses ADD_SAM1 to ADD_SAMi by randomly sampling the active address ADD_ACT. In detail, the second sampling circuit 234 may include a second random signal generator 2342 and a second sampling latch circuit 2344. The second random signal generator 2342 may generate a second sampling signal SAM_EN2 that is randomly toggling, based on the internal clock CLK. The second random signal generator 2342 may be implemented with a linear feedback shift register (LFSR) based random pattern generator or a pseudo-random binary sequence (PRBS) based random pattern generator. The second sampling latch circuit 2344 may store the active address ADD_ACT as the sampling addresses ADD_SAM1 to ADD_SAMi, according to the second sampling signal SAM_EN2. For example, the second sampling latch circuit 2344 may include a plurality of latches LAT20 to LAT2i, which may sequentially store the active address ADD_ACT as the sampling addresses ADD_SAM1 to ADD_SAMi whenever the second sampling signal SAM_EN2 is enabled.

The output control circuit 236 may sequentially output the sampling addresses ADD_SAM1 to ADD_SAMi, and calculate one or more adjacent addresses using the sampling address to be outputted, according to the second target refresh command TREF2. Then, the output control circuit 236 may output the calculated adjacent addresses as the second row-hammer address ADD_RH2. The output control circuit 236 may mask the current sampling address and output the next sampling address as the second row-hammer address ADD_RH2 when a comparison signal HIT is enabled.

The address select circuit 238 may output the target address TADD by selecting any of the first row-hammer address ADD_RH1 and the second row-hammer address ADD_RH2 according to the first target refresh command TREF1 or the second target refresh command TREF2. The address select circuit 238 may generate the comparison signal HIT by comparing the first row-hammer address ADD_RH1 with the second row-hammer address ADD_RH2. For example, referring to FIG. 10, the address select circuit 238 may include a selector 2382 and a comparator 2384. The selector 2382 may output the target address TADD by selecting any of the first row-hammer address ADD_RH1 and the second row-hammer address ADD_RH2 according to the first target refresh command TREF1 or the second target refresh command TREF2. The comparator 2384 may compare the first row-hammer address ADD_RH1 with the second row-hammer address ADD_RH2, and enable the comparison signal HIT when respective bits in the first row-hammer address ADD_RH1 are identical to those in the second row-hammer address ADD_RH2.

The row control circuit 212 may activate at least one word line WL corresponding to the internal address IADD according to the active command ACT, and precharge the activated word line WL according to the precharge command PCG. The row control circuit 212 may perform a normal refresh operation of sequentially refreshing the plurality of word lines WL corresponding to a counting address according to the normal refresh command REF. The row control circuit 212 may perform a target refresh operation of refreshing one or more neighboring word lines WL corresponding to the target address TADD according to the first target refresh command TREF1 or the second target refresh command TREF2.

As described above, the semiconductor memory device 200 of FIG. 9 may perform the target refresh operation on adjacent word lines corresponding to the first row-hammer address ADD_RH1 in response to the first target refresh command TREF1, and perform the target refresh operation on adjacent word lines corresponding to the second row-hammer address ADD_RH2, which is different from the first row-hammer address ADD_RH1, in response to the second target refresh command TREF2. Thus, the memory system 10 in accordance with an embodiment may prevent unnecessary target refresh operations according to the same address, thereby improving refresh efficiency.

Hereinafter, referring to FIGS. 1 to 11, an operation of a memory system will be described.

Figure 11:
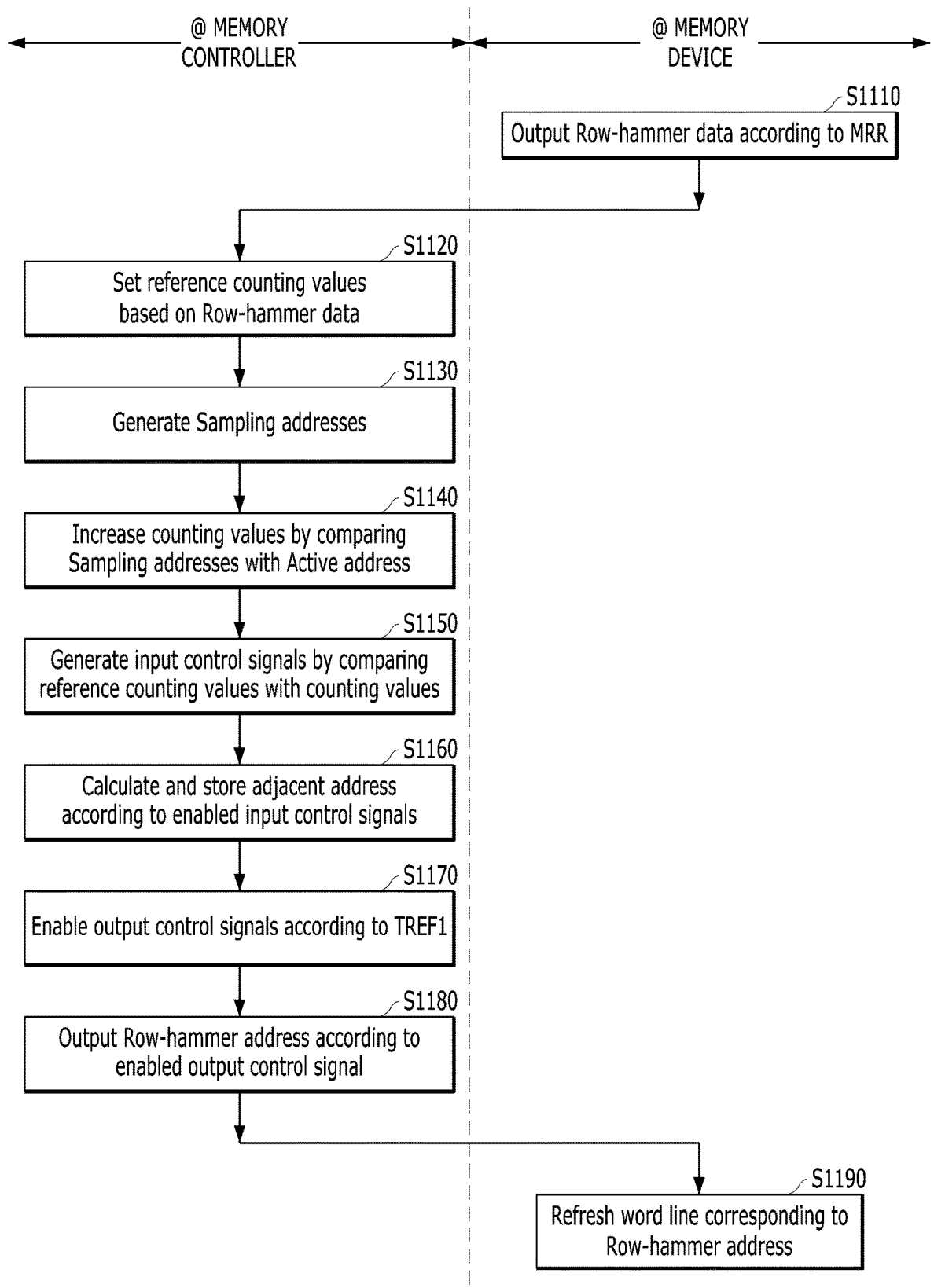
FIG. 11 is a flow chart for describing an operation of a memory system in accordance with an embodiment of the present invention.

FIG. 11 is a flow chart for describing an operation of a memory system in accordance with an embodiment of the present invention.

Referring to FIG. 11, in response to the mode register read command MRR, the semiconductor memory device 200 may output the stored row-hammer data MR_RHR to the memory controller 100 in the form of the data DQ (at S1110). In particular, the row-hammer data MR_RHR may include information on refresh rates for adjacent word lines set according to a physical distance from a target word line. Hereinafter, as an example, the row-hammer data MR_RHR may include a refresh rate of 1 for N±1 adjacent word lines, a refresh rate of 0.2 for N±2 adjacent word lines, and a refresh rate of 0.1 for N±3 adjacent word lines.

The radius analysis circuit 350 of the memory controller 100 may set the plurality of reference counting values N1_SET to Nk_SET based on refresh rates for N±1, N±2, . . . N±k adjacent word lines included in the row-hammer data MR_RHR (at S1120). For example, the setting storage circuit 352 of the radius analysis circuit 350 may set the first reference counting values N1_SET of "1", the second reference counting values N2_SET of "5", and the third reference counting values N3_SET of "10".

The first sampling circuit 310 may generate the plurality of sampling addresses SAM_ADD1 to SAM_ADDm by sampling the active address ACT_ADD (at S1130). Whenever the active address ACT_ADD is inputted, the address counting circuit 330 may compare the sampling addresses SAM_ADD1 to SAM_ADDm with the active address ACT_ADD, and increase a counting value CNT_Vx corresponding to a sampling address matching the active address ACT_ADD, by "+1" (at S1140). When the counting value CNT_Vx is changed, the changed counting value CNT_Vx and the corresponding sampling address SAM_ADDx are provided to the radius analysis circuit 350.

The latch control circuit 354 of the radius analysis circuit 350 may generate the first to k-th input control signals PI<1:k> by comparing the changed counting value CNT_Vx with the first to k-th reference counting values N1_SET to Nk_SET (at S1150). The row-hammer address latch circuit 356 may calculate one or more adjacent addresses SAM_ADD_ADJ using the sampling address SAM_ADDx, and selectively store the adjacent addresses SAM_ADD_ADJ in any from the first to k-th latch circuits P_LAT1 to P_LATk, according to an enabled one among the first to k-th input control signals PI<1:k> (at S1160).

For example, when the second counting value CNT_V2 for the second sampling address SAM_ADD2 is increased to "1", the latch control circuit 354 may enable the first input control signal PI<1> since the changed counting value CNT_V2 is identical to the first reference counting value N1_SET. According to the first input control signal PI<1>, the row-hammer address latch circuit 356 may calculate one or more adjacent addresses SAM_ADD_ADJ by increasing and/or decreasing the second sampling address SAM_ADD2 by "+1", and store the adjacent addresses SAM_ADD_ADJ in the first latch circuit P_LAT1 of the pipe latch circuit 3564.

Thereafter, when the second counting value CNT_V2 for the second sampling address SAM_ADD2 is increased to "5", the latch control circuit 354 may enable the second input control signal PI<2> since the changed counting value CNT_V2 is identical to the second reference counting value N2_SET. According to the second input control signal PI<2>, the row-hammer address latch circuit 356 may calculate one or more adjacent addresses SAM_ADD_ADJ by increasing and/or decreasing the second sampling address SAM_ADD2 by "+2", and store the adjacent addresses SAM_ADD_ADJ in the second latch circuit P_LAT2 of the pipe latch circuit 3564.

Thereafter, when the second counting value CNT_V2 for the second sampling address SAM_ADD2 is increased to "10", the latch control circuit 354 may enable the third input control signal PI<3> since the changed counting value CNT_V2 is identical to the third reference counting value N3_SET. According to the third input control signal PI<3>, the row-hammer address latch circuit 356 may calculate one or more adjacent addresses SAM_ADD_ADJ by increasing and/or decreasing the second sampling address SAM_ADD2 by "+3", and store the adjacent addresses SAM_ADD_ADJ in the third latch circuit P_LAT3 of the pipe latch circuit 3564.

In this way, as the distance from the target word line increases, the probability of storing adjacent addresses in the row-hammer address latch circuit 356 decreases, and thus the refresh rate may decrease. That is, the N±2 adjacent word lines may be target refreshed with the probability of 100% when the N±1 adjacent word lines are sampled; the N±2 adjacent word lines may be target refreshed with the probability of 20% when the N±2 adjacent word lines are sampled; and the N±3 adjacent word lines may be target refreshed with the probability of 10% when the N±3 adjacent word lines are sampled.

Thereafter, the latch control circuit 354 may sequentially enable the first to k-th output control signals PO<1:k> whenever the first target refresh command TREF1 is inputted (at S1170). The row-hammer address latch circuit 356 may output the adjacent addresses stored in any of the first to k-th latch circuits P_LAT1 to P_LATk, as the first row-hammer address RH_ADD, according to an enabled one among the first to k-th output control signals PO<1:k> (at S1180). The memory controller 100 may provide the first target refresh command TREF1 together with the first row-hammer address RH_ADD as the command/address signal C/A.

The semiconductor memory device 200 may perform a target refresh operation of refreshing one or more word lines corresponding to the first row-hammer address RH_ADD according to the first target refresh command TREF1 (at S1190).

In a case of the semiconductor memory device 200 of FIG. 8, the refresh control circuit 230 may provide the target address TADD corresponding to the first row-hammer address RH_ADD by latching the internal address IADD according to the first target refresh command TREF1. The row control circuit 212 may perform the target refresh operation of refreshing one or more neighboring word lines WL corresponding to the target address TADD according to the first target refresh command TREF1.

In a case of the semiconductor memory device 200 of FIG. 9, the refresh control circuit 230' may latch the internal address IADD as the first row-hammer address ADD_RH1 according to the first target refresh command TREF1. The target command generation circuit 224 may generate the second target refresh command TREF2 whenever the number of inputs of the normal refresh command REF reaches a certain number. The refresh control circuit 230' may latch the internal address IADD as the active address ADD_ACT according to the active command ACT, and randomly sample the active address ADD_ACT to store the sampling addresses ADD_SAM1 to ADD_SAMi. The refresh control circuit 230' may sequentially output the sampling addresses ADD_SAM1 to ADD_SAMi as the second row-hammer address ADD_RH2 according to the second target refresh command TREF2. The refresh control circuit 230' may output the target address TADD by selecting any of the first row-hammer address ADD_RH1 and the second row-hammer address ADD_RH2. The row control circuit 212 may perform the target refresh operation of refreshing one or more neighboring word lines WL corresponding to the target address TADD according to the first target refresh command TREF1 or the second target refresh command TREF2.

According to embodiments of the present invention, the memory system 10 may control the closer the physical distance from the target word line, the higher the refresh rate of adjacent word lines, and the farther the physical distance, the lower the refresh rate of adjacent word lines. Accordingly, the memory system 10 may prevent a decrease in refresh efficiency and accuracy that may occur when the same refresh rate is applied to all adjacent word lines, optimize low-hammer defense capabilities, and minimize power consumption.

Various embodiments of the present invention have been described in the drawings and specification. Although specific terminologies are used here, the terminologies are only to describe the embodiments of the present invention. Therefore, the present invention is not restricted to the above-described embodiments and many variations are possible within the spirit and scope of the present invention. It should be apparent to those skilled in the art that various modifications can be made on the basis of the technological scope of the present invention in addition to the embodiments disclosed herein. The embodiments may be combined to form additional embodiments.

It should be noted that although the technical spirit of this disclosure has been described in connection with embodiments thereof, this is merely for description purposes and should not be interpreted as limiting. It should be appreciated by one of ordinary skill in the art that various changes may be made thereto without departing from the technical spirit of this disclosure and the following claims.

For example, for the logic gates and transistors provided as examples in the above-described embodiments, different positions and types may be implemented depending on the polarity of the input signal.

What is claimed is:

1. A memory system, comprising:
a memory device suitable for:
providing row-hammer data to set refresh rates for adjacent word lines of a target word line, and
performing a target refresh operation on one or more word lines corresponding to a first row-hammer address according to a first target refresh command; and
a memory controller suitable for:
generating a plurality of sampling addresses by sampling an active address,
generating a plurality of counting values corresponding to the plurality of sampling addresses by comparing the plurality of sampling addresses with the active address and incrementing a counting value of the plurality of counting values for a match in the comparing of the plurality of sampling addresses with the active address,
calculating, when there is the match between the plurality of sampling addresses and the active address, a plurality of adjacent addresses corresponding to and incrementally changed from the plurality of sampling addresses based on the plurality of counting values and the row-hammer data, and
providing the plurality of adjacent addresses as the first row-hammer address with the first target refresh command.

2. The memory system of claim 1, wherein the row-hammer data includes information on the refresh rates for the adjacent word lines set according to a physical distance from the target word line.

3. The memory system of claim 1, wherein the semiconductor memory device includes a mode setting circuit suitable for storing the row-hammer data and providing the stored row-hammer data to the memory controller in response to a mode register read command in the form of data.

4. The memory system of claim 1,
wherein the memory controller is further suitable for setting a plurality of reference counting values based on the row-hammer data,
wherein the memory controller includes a plurality of latch circuits respectively corresponding to the plurality of reference counting values,
wherein the memory controller is further suitable for comparing the plurality of reference counting values with the plurality of counting values,
wherein the memory controller calculates the plurality of adjacent addresses using a corresponding sampling address when a result of the comparing of the plurality of reference counting values with the plurality of counting values matches,
wherein the memory controller is further suitable for storing the plurality of adjacent addresses into the plurality of latch circuits, and
wherein the memory controller provides the stored adjacent addresses as the first row-hammer address according to the first target refresh command.

5. The memory system of claim 1, wherein the memory controller is further suitable for generating the first target refresh command whenever a number of inputs of an active command reaches a certain number.

6. The memory system of claim 1, wherein the memory controller includes:
a first sampling circuit suitable for storing the plurality of sampling addresses by sampling the active address;
an address counting circuit suitable for generating the plurality of counting values corresponding to the plurality of sampling addresses, and increasing a counting value corresponding to a sampling address matching the active address; and
a radius analysis circuit suitable for:
setting a plurality of reference counting values based on the row-hammer data,
calculating one or more adjacent addresses by comparing the increased counting value with the plurality of reference counting values, and
providing the plurality of adjacent addresses as the first row-hammer address according to the first target refresh command.

7. The memory system of claim 6, wherein the first sampling circuit includes:
a first random signal generator suitable for generating a first sampling signal that is randomly enabled; and
a first sampling latch circuit suitable for sequentially storing the active address, as the plurality of sampling addresses, according to the first sampling signal.

8. The memory system of claim 6, wherein the radius analysis circuit includes:
a setting storage circuit suitable for setting the plurality of reference counting values based on the row-hammer data;
a latch control circuit suitable for generating a plurality of input control signals by comparing the increased counting value with the plurality of reference counting values, and generating a plurality of output control signals according to the first target refresh command; and
a row-hammer address latch circuit suitable for calculating and storing the plurality of adjacent addresses using the plurality of sampling addresses according to the plurality of input control signals, and outputting the stored adjacent addresses as the first row-hammer address according to the plurality of output control signals.

9. The memory system of claim 8, wherein the latch control circuit includes:
an input control circuit including a plurality of comparators, each comparator suitable for comparing the increased counting value with a corresponding reference counting value to enable a corresponding input control signal when a comparison result matches; and
an output control circuit suitable for sequentially enabling the plurality of output control signals whenever the first target refresh command is inputted.

10. The memory system of claim 8, wherein the row-hammer address latch circuit includes:
an adjacent address calculating circuit suitable for calculating the plurality of adjacent addresses using the sampling address according to an enabled input control signal; and
a pipe latch circuit suitable for storing the plurality of adjacent addresses according to the plurality of input control signals, and outputting the stored adjacent addresses as the first row-hammer address according to the plurality of output control signals.

11. The memory system of claim 1, wherein the semiconductor memory device includes:
- a mode setting circuit suitable for storing the row-hammer data, and providing the stored row-hammer data to the memory controller through a data bus in response to a mode register read command;
- a refresh control circuit suitable for providing a target address corresponding to the first row-hammer address according to the first target refresh command; and
- a row control circuit suitable for performing the target refresh operation on the one or more word lines corresponding to the target address according to the first target refresh command.

12. The memory system of claim 1, wherein the semiconductor memory device includes:
- a mode setting circuit suitable for storing the row-hammer data, and providing the stored row-hammer data to the memory controller through a data bus in response to a mode register read command;
- a refresh control circuit suitable for generating a plurality of secondary sampling addresses by sampling the active address, sequentially outputting the plurality of secondary sampling addresses as a second row-hammer address according to a second target refresh command, and outputting a target address by selecting any of the first row-hammer address and the second row-hammer address; and
- a row control circuit suitable for performing the target refresh operation on the one or more word lines corresponding to the target address according to the first target refresh command or the second target refresh command.

13. The memory system of claim 12, wherein the semiconductor memory device further includes a target command generation circuit suitable for generating the second target refresh command when a number of inputs of normal refresh command reaches a certain number.

14. The memory system of claim 12, wherein the refresh control circuit includes:
- a second sampling circuit suitable for generating the plurality of secondary sampling addresses by sampling the active address;
- an output control circuit suitable for sequentially outputting the plurality of secondary sampling addresses as the second row-hammer address according to the second target refresh command, while masking a current secondary sampling address in response to a comparison signal; and
- an address select circuit suitable for outputting the target address by selecting any of the first row-hammer address and the second row-hammer address according to the first target refresh command or the second target refresh command, and generating the comparison signal when the first row-hammer address is identical to the second row-hammer address.

15. An operation method of a memory system, comprising:
- providing, at a memory device, row-hammer data to set refresh rates for adjacent word lines of a target word line;
- generating, at a memory controller, a plurality of sampling addresses by sampling an active address;
- generating, at the memory controller, a plurality of counting values corresponding to the plurality of sampling addresses by comparing the plurality of sampling addresses with the active address and incrementing a counting value of the plurality of counting values for a match in the comparing of the plurality of sampling addresses with the active address;
- calculating, at the memory controller and when there is the match between the plurality of sampling addresses and the active address, a plurality of adjacent addresses corresponding to and incrementally changed from the plurality of sampling addresses based on the plurality of counting values and the row-hammer data;
- providing, at the memory controller, the plurality of adjacent addresses as a row-hammer address with a target refresh command; and
- performing, at the memory device, a target refresh operation on one or more word lines corresponding to the row-hammer address according to the target refresh command.

16. The operation method of claim 15, wherein the row-hammer data includes information on the refresh rates for the adjacent word lines set according to a physical distance from the target word line.

17. The operation method of claim 15, wherein the providing of the row-hammer data includes providing the row-hammer data stored in a mode setting circuit to the memory controller in response to a mode register read command in the form of data.

18. The operation method of claim 15, wherein the calculating of the plurality of adjacent addresses corresponding to the plurality of sampling addresses includes:
- setting a plurality of reference counting values based on the row-hammer data;
- generating a plurality of input control signals by comparing the plurality of counting values with the plurality of reference counting values; and
- calculating and storing the plurality of adjacent addresses using the plurality of sampling addresses according to the plurality of input control signals.

19. The operation method of claim 15, further comprising generating, at the memory controller, the target refresh command when a number of inputs of an active command reaches a certain number.

* * * * *